(12) United States Patent
Veller et al.

(10) Patent No.: US 8,719,742 B2
(45) Date of Patent: May 6, 2014

(54) CONVERSION OF CIRCUIT DESCRIPTION TO AN ABSTRACT MODEL OF THE CIRCUIT

(75) Inventors: Yossi Veller, Herzliya (IL); Vasile Hanga, Netanya (IL); Alexander Rozenman, Rishon Lezion (IL); Rami Rachamim, Tel Aviv (IL)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/400,521

(22) Filed: Feb. 20, 2012

(65) Prior Publication Data

US 2012/0150522 A1 Jun. 14, 2012

Related U.S. Application Data

(60) Division of application No. 11/811,685, filed on Jun. 11, 2007, now Pat. No. 8,122,398, which is a continuation of application No. PCT/IL2006/001349, filed on Nov. 23, 2006.

(60) Provisional application No. 60/748,957, filed on Dec. 8, 2005.

(51) Int. Cl.
*G06F 17/50* (2006.01)

(52) U.S. Cl.
USPC .......................................... 716/103; 716/106

(58) Field of Classification Search
USPC .................. 716/119–125, 103–106
See application file for complete search history.

(56) References Cited

U.S. PATENT DOCUMENTS

| | | | |
|---|---|---|---|
| 5,602,753 A | 2/1997 | Fukui | |
| 5,752,002 A | 5/1998 | Naidu et al. | |
| 6,263,301 B1 | 7/2001 | Cox et al. | |
| 6,324,678 B1 * | 11/2001 | Dangelo et al. | 716/103 |
| 6,637,018 B1 * | 10/2003 | Demler | 716/104 |

(Continued)

FOREIGN PATENT DOCUMENTS

| | | |
|---|---|---|
| WO | WO02/08966 | 1/2002 |
| WO | WO03098491 A1 | 11/2003 |
| WO | PCT/IL2006/001348 | 3/2007 |
| WO | PCT/IL2006/001349 | 4/2007 |
| WO | PCT/IL2006/001350 | 4/2007 |

OTHER PUBLICATIONS

U.S. Appl. No. 11/811,680, filed Jun. 11, 2007, Yossi Veller et al.

(Continued)

*Primary Examiner* — Binh Tat
(74) *Attorney, Agent, or Firm* — Klarquist Sparkman, LLP

(57) ABSTRACT

A system and method is disclosed for converting an existing circuit description from a lower level description, such as RTL, to a higher-level description, such as TLM, while raising the abstraction level. By changing the abstraction level, the conversion is not simply a code conversion from one language to another, but a process of learning the circuit using neural networks and representing the circuit using a system of equations that approximate the circuit behavior, particularly with respect to timing aspects. A higher level of abstraction eliminates much of the particular implementation details, and allows easier and faster design exploration, analysis, and test, before implementation. In one aspect, a model description of the circuit, protocol information relating to the circuit, and simulation data associated with the lower level description of the circuit are used to generate an abstract model of the circuit that approximates the circuit behavior.

14 Claims, 17 Drawing Sheets

(56) References Cited

U.S. PATENT DOCUMENTS

| | | | |
|---|---|---|---|
| 6,845,341 B2 | 1/2005 | Beverly et al. | |
| 6,910,025 B2 | 6/2005 | Cao | |
| 7,080,365 B2* | 7/2006 | Broughton et al. | 717/146 |
| 7,136,947 B1 | 11/2006 | Passerone et al. | |
| 7,290,056 B1 | 10/2007 | McLaughlin | |
| 7,490,030 B2 | 2/2009 | Burton et al. | |
| 7,512,732 B1 | 3/2009 | Goossens | |
| 2002/0004927 A1 | 1/2002 | Takahashi et al. | |
| 2002/0078423 A1 | 6/2002 | Alden et al. | |
| 2003/0037305 A1* | 2/2003 | Chen et al. | 716/4 |
| 2003/0061580 A1* | 3/2003 | Greaves | 716/4 |
| 2003/0097348 A1 | 5/2003 | Cao | |
| 2003/0226124 A1 | 12/2003 | Marschner et al. | |
| 2004/0063434 A1 | 4/2004 | Hamalainen et al. | |
| 2004/0088151 A1 | 5/2004 | Burton et al. | |
| 2005/0131666 A1 | 6/2005 | Tsai et al. | |
| 2005/0132306 A1 | 6/2005 | Smith et al. | |
| 2005/0192787 A1 | 9/2005 | Kuwahara et al. | |
| 2005/0197982 A1 | 9/2005 | Saidi et al. | |
| 2005/0257178 A1 | 11/2005 | Daems et al. | |
| 2006/0150129 A1* | 7/2006 | Chiu et al. | 716/4 |
| 2007/0168893 A1 | 7/2007 | Watanabe et al. | |
| 2008/0072182 A1* | 3/2008 | He et al. | 716/2 |
| 2008/0120082 A1 | 5/2008 | Alexanian et al. | |

OTHER PUBLICATIONS

U.S. Appl. No. 11/811,695, filed Jun. 11, 2007, Yossi Veller et al.

Bernstein, A., et al, "How to bridge the abstraction gap in system level modeling and design," Computer Aided Design, 2004. ICCAD-2004, Nov. 7, 2004, pp. 910-914.

Caldari et al., "Instruction Based Power Consumption Estimation Methodology", IEEE 2002, pp. 721-724.

Cavalli et al., "New approaches for passive testing using an Extended Finite State Machine specification," Information and Software Technology 45, pp. 837-852, 2003.

Cavalli et al., "Passive testing and application to the GSM-MAP protocol," Information and Software Technology 41, pp. 813-821, Elsevier Science B.V., 1999.

Dhanwada et al., "A Power Estimation Methodology for SystemC Transaction Level Models," CODES+ISSS'05, Sep. 19-21, 2005, IEEE, pp. 142-147.

Di Bennetto, "Model Matching for Finite-State Machines," IEEE Transaction on Automatic Control, vol. 46, No. 11, Nov. 2001.

Givargis et al., "Trace-driven System-level Power Evaluation of System-on-a-chip Peripheral Cores," IEEE 2001, pp. 302-311.

International Search Report of PCT/IL2006/001348, mailed Mar. 27, 2007, 2 pages.

International Search Report of PCT/IL2006/001349, mailed Apr. 24, 2007, 2 pages.

International Search Report of PCT/IL2006/001350, mailed Apr. 17, 2007, 2 pages.

Jindal, R. et al, "Verification of transaction-level system models using RTL testbenches," Formal Methods and Models for Co-Design, 2003. Memocode '03 Proceedings, Jun. 24, 2003, pp. 200-202.

Nam Sung Kim, et al., "Microarchitectural Power Modeling Techniques for Deep Sub-Micron Microprocessors," Proceedings of the 2004 International Symposium on Low Power Electronics and Design. ISLPED 2004, Aug. 9, 2004, pp. 211-217.

* cited by examiner

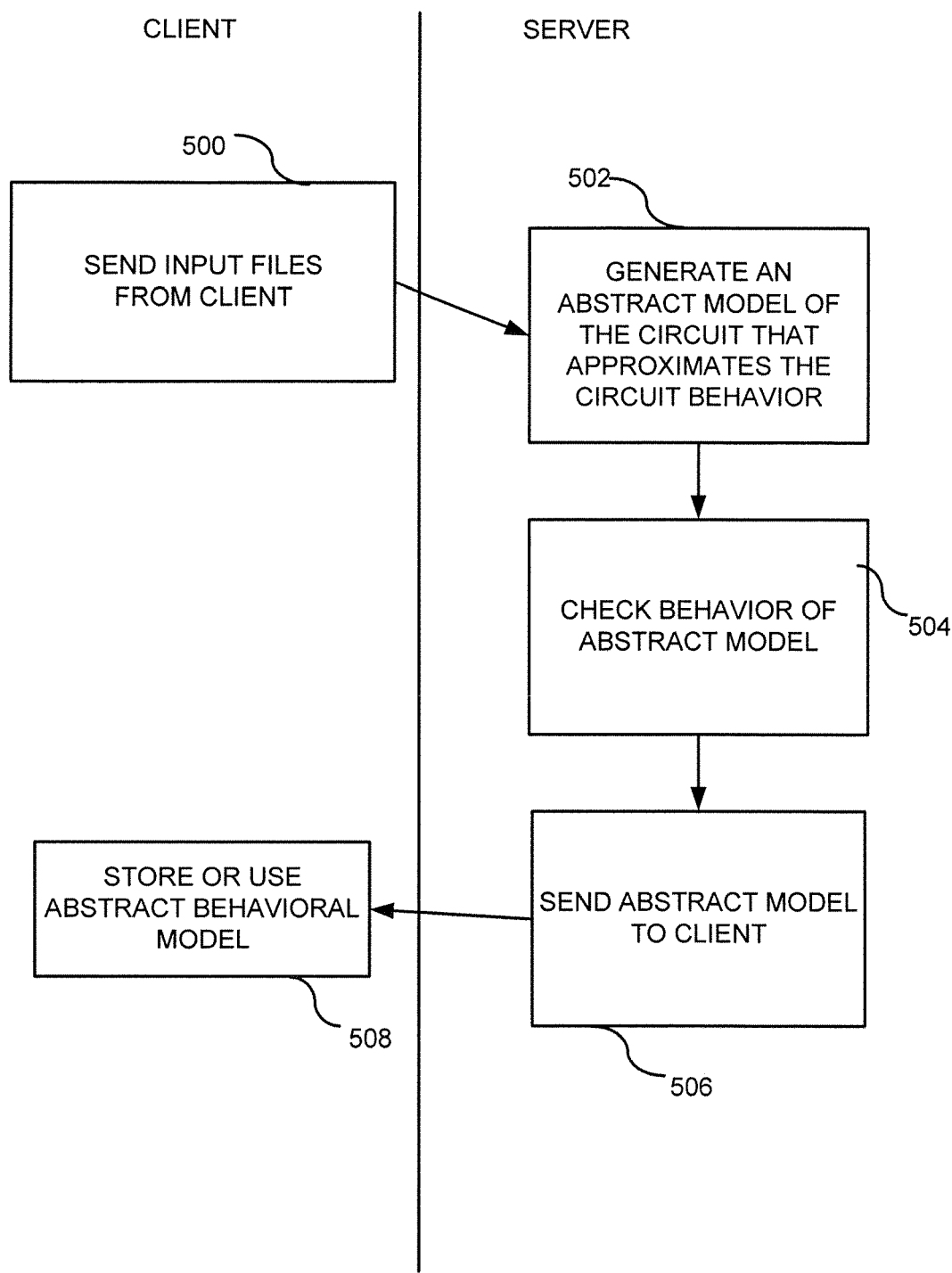

CONVERSION OF CIRCUIT DESCRIPTION TO AN ABSTRACT MODEL OF THE CIRCUIT

CROSS-REFERENCE TO RELATED APPLICATIONS

This application is a divisional of U.S. patent application Ser. No. 11/811,685, filed Jun. 11, 2007, now U.S. Pat. No. 8,123,398 which is a continuation of International Patent Application No. PCT/IL2006/001349, filed on Nov. 23, 2006, which claims the benefit of U.S. Provisional Patent Application No. 60/748,957, filed Dec. 8, 2005, all of which are herein incorporated by reference.

FIELD OF THE INVENTION

The present invention generally relates to simulation, and more particularly to converting a simulated circuit description to a higher level of abstraction.

BACKGROUND

The complexity of integrated circuits (ICs) being designed nowadays is continuously increasing and has resulted in complete system-on-chip (SoC) solutions. Even more, the complexity of such integrated systems is exploding thanks to advances in process fabrication. The limiting factor is now the ability to design, manage and verify such systems rather than the ability to fabricate them.

The typical design process begins with a software program that describes the behavior or functionality of a circuit. This software program is written in a hardware description language (HDL) that defines a behavior to be performed with limited implementation details. Logic synthesis tools convert the HDL program into a gate netlist description. The RTL description is used to verify functionality and ultimately generate a netlist that includes a list of components in the circuit and the interconnections between the components. This netlist is used to create the physical integrated circuit.

As SoC's are becoming larger, the only way to efficiently design such dense SoC's, both from the design complexity and time-to-market aspects, is by embedding Intellectual Property (IP) cores. Standards for such cores are currently evolving. Ideally, they should be reusable, pre-characterized and pre-verified. But it often desirable to change the design to create the next generation. For example, as fabrication technology changes, it is desirable to convert or migrate the design to the new process parameters. For example, an IP core may be designed and tested for 90 nm technology, but it is desirable to convert the IP core to a new process of 60 nm technology. Or it may be desirable to update the design and incorporate changes in order to create the next generation design.

In order to test and explore such changes in the design, simulation must be performed, which is very time consuming. A few seconds of real-time simulation can take weeks or even months. If the simulation results are not desirable, then the design process must start over again by changing the high-level code and re-simulating.

Because of such delays in simulation, designers are beginning to move the design process to a higher level of abstraction (meaning less focus on design details). At the higher level of abstraction, design exploration can be performed to evaluate which performance and power consumption can be achieved, which parts to use, etc. The preferable higher level of abstraction is called Transaction Level Modeling (TLM), which refers to the evolving design and verification space called Electronic System Level (ESL) with methodologies that begin at a higher level of abstraction than the current mainstream Register Transfer Level (RTL). The main ESL design language SystemC, is driven from C/C++ rather than from hardware languages like Verilog and VHDL.

The challenge is how to rewrite or convert existing models and code at the register transfer level to models and code at the electronic system level. There are some tools available that can make such a conversion, such as VTOC available from Tenison Corporation, but these tools do a simple code conversion without changing the level of abstraction. Thus, for example, having the same level of abstraction, including the same level of design details, means that the verification and simulation are just as slow.

A simple example is if an engineer wants to use an existing circuit, but increase the memory size. There are no guarantees that making such an update will work. For example, increased memory size may drain the battery too quickly rendering the circuit unmarketable. Using current tools, the designer must either physically implement the circuit to see if it works or modify the RTL code and simulate the design. Such simulation may take weeks or even months, and if the modification does not work, the process must be started over again.

Thus, it is desirable to convert an existing design from a lower level of code, such as RTL, to a higher level, such as ESL, while changing the abstraction level of the design in order to gain the benefits of having the code at the higher level.

SUMMARY

A system and method are disclosed for converting an existing circuit description, specifically its timing characteristics, from a lower level description, such as RTL, to a higher-level description, such as TLM, while raising the abstraction level. By changing the abstraction level, the conversion is not simply a code conversion from one language to another, but a process of learning the circuit using neural networks and representing the circuit using a system of equations that approximate the circuit behavior, particularly with respect to timing aspects. A higher level of abstraction eliminates much of the particular implementation details, and allows easier and faster design exploration, analysis, and test, before implementation.

In one aspect, a model description of the circuit, protocol information relating to the circuit, and simulation data associated with the lower level description of the circuit are used to generate an abstract model of the circuit that approximates the circuit timing behavior.

In another aspect, such generation is accomplished using machine learning algorithms and/or a neural network. The neural network generates a system of weighted equations. Input patterns are used to calculate a difference between the actual output values (using the equations) and desired values (using simulated data) and extract a deterministic behavior. The weights of the equations can then be modified.

In yet another aspect, causality analysis is used in order to synthesize the model description, protocol information and simulation data. The synthesized data may then be passed more efficiently through the neural network.

In another aspect, the resulting abstract model can be simulated as-is to run pure performance analysis of a system, or can be plugged into TLM functional models and used to provide timing and functional behavior during fully functional simulation.

These features and others of the described embodiments will be more readily apparent from the following detailed description, which proceeds with reference to the accompanying drawings.

BRIEF DESCRIPTION OF THE DRAWINGS

FIG. 17 is an exemplary flowchart of a method for implementing the invention over the network of FIG. 16.

DETAILED DESCRIPTION

Figure 1:
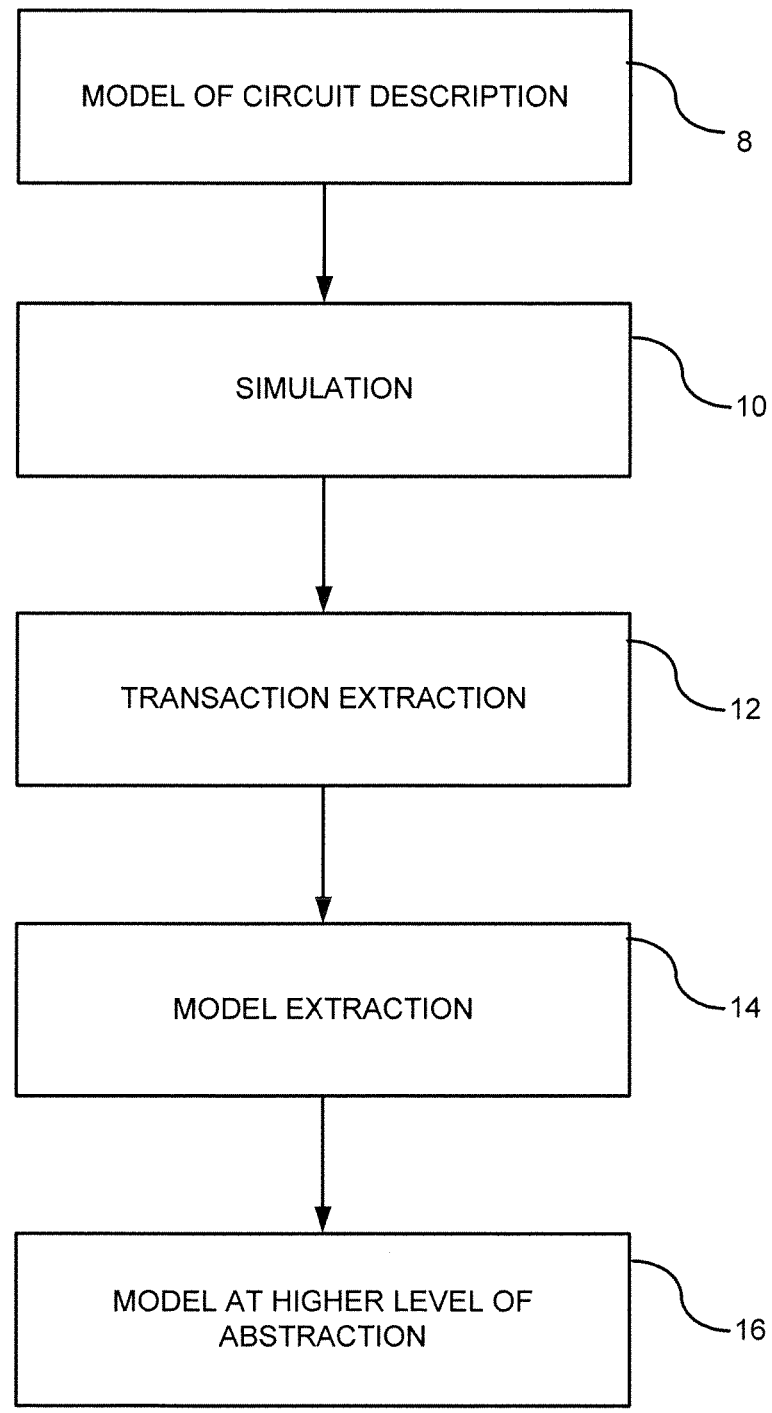
FIG. 1 is a high-level flowchart of a method for converting a circuit description from a lower-level description into a higher-level description, while changing the level of abstraction.

FIG. 1 shows a high-level flowchart for converting a circuit description from a low-level description (e.g., HDL, RTL) to a higher level of abstraction, such as a transaction level model (TLM). The low-level description generally includes details at the signal level, while the TLM uses high level functions and equations to calculate output transactions based on inputs and is not concerned with the device-level implementation of the circuit. ESL is an emerging electronic design methodology, which focuses on the higher abstraction level. Electronic System Level is now an established approach at most of the world's leading System-on-a-chip (SoC) design companies, and is being used increasingly in system design. From its genesis as an algorithm modeling methodology with 'no links to implementation', ESL is evolving into a set of complementary methodologies that enable embedded system design, verification, and debugging through to the hardware and software implementation of custom SoC, system-on-FPGA, system-on-board, and entire multi-board systems. ESL can be accomplished through the use of SystemC as an abstract modeling language.

Figure 2:
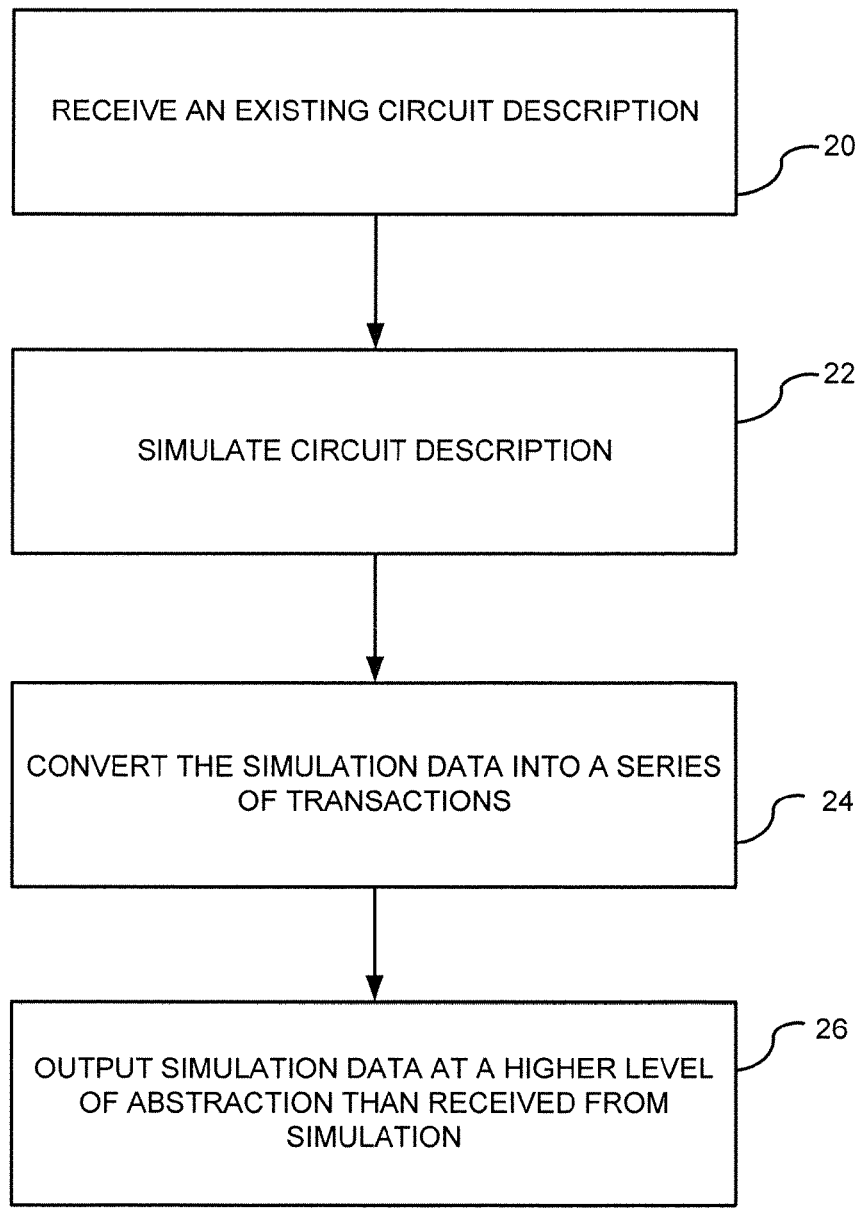
FIG. 2 is a flowchart of a method for converting a description of a circuit simulation into a series of transactions through message extraction.

At process box 10, simulation is performed on the low-level circuit description. At process box 12, transactions are extracted from the simulation data. The simulation and transaction extraction process are described more fully in relation to FIGS. 2-8, but basically the system maps signal patterns into messages using pre-defined protocols (e.g., AMBA, PCI, etc.). Then the messages are converted to transactions. At process box 14, model extraction is performed. The model extraction is described more fully in relation to FIGS. 9-17, but generally the system looks to repetitive correlation (i.e., deterministic behavior) between input sequences and output messages. Neural network functions are used to calculate the output message generation and extrapolate statistical behavior of a component. Additionally, data dependencies can be extracted. Finally, in process box 16, the model is output at the higher level of abstraction. The model, in a sense, is like a black box where input transactions/messages are analyzed to generate output transactions/messages, without a focus on signal levels and values, but more a focus on timing and relationships between messages. The resulting abstract model can be simulated as-is to run pure performance analysis of a system, or can be plugged into TLM functional models and used to provide timing and functional behavior during fully functional simulation FIG. 2 shows a flowchart of a method for converting simulation data of a circuit description to a transaction-based description, which is at a higher layer of abstraction. In process box 20, simulation data of a circuit description is received. The circuit description may be in HDL or any other software language and it may be compiled and simulated as part of a system design flow or it may be separately compiled and simulated. Thus, the simulation can be run in combination with the conversion process to a transaction-based description, or it can be run on a separate machine at a separate time. Any desired simulator may be used, such as ModelSim®, available from Mentor Graphics Corporation, or VCD (Value Change Dump) files generated by any other simulator. In process box 24, the simulated circuit is converted into a series of transactions associated with a predetermined protocol. The protocol used is typically provided as input into the system by the user. In process box 26, the simulation data is output in the form of the transactions, which is a higher level of abstraction than the received simulated circuit design. For example, FIG. 4 shows a simulated circuit description, which is at a signal level including a plurality of signals on various hardware lines. FIG. 8 illustrates the converted circuit description at a transaction level. The output may be achieved by a variety of techniques, such as displayed to the user on a display (not shown), output to a file, etc.

Figure 3:
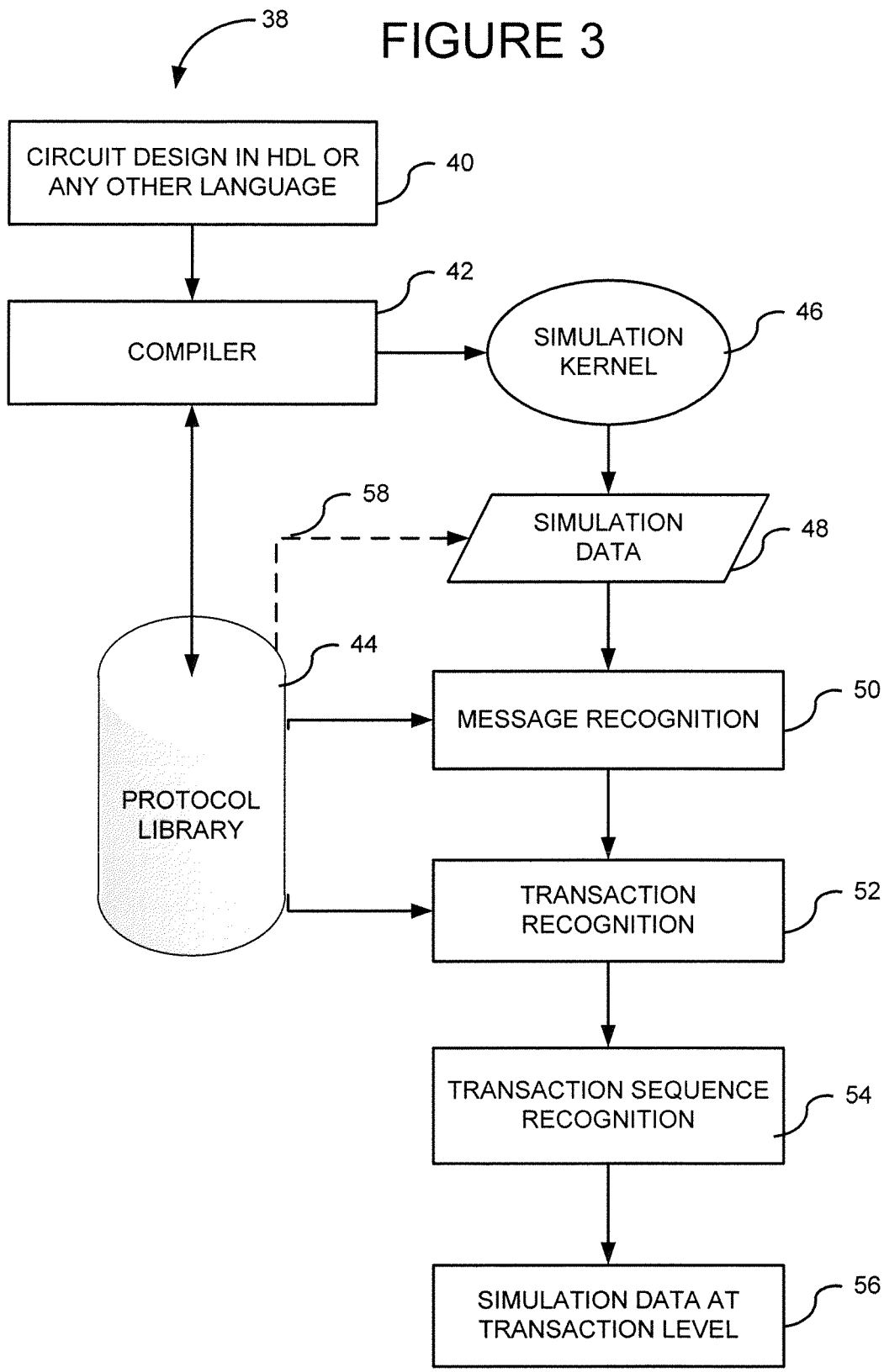
FIG. 3 is a hardware diagram of a system used to convert the description of the circuit into transactions.
Figure 4:
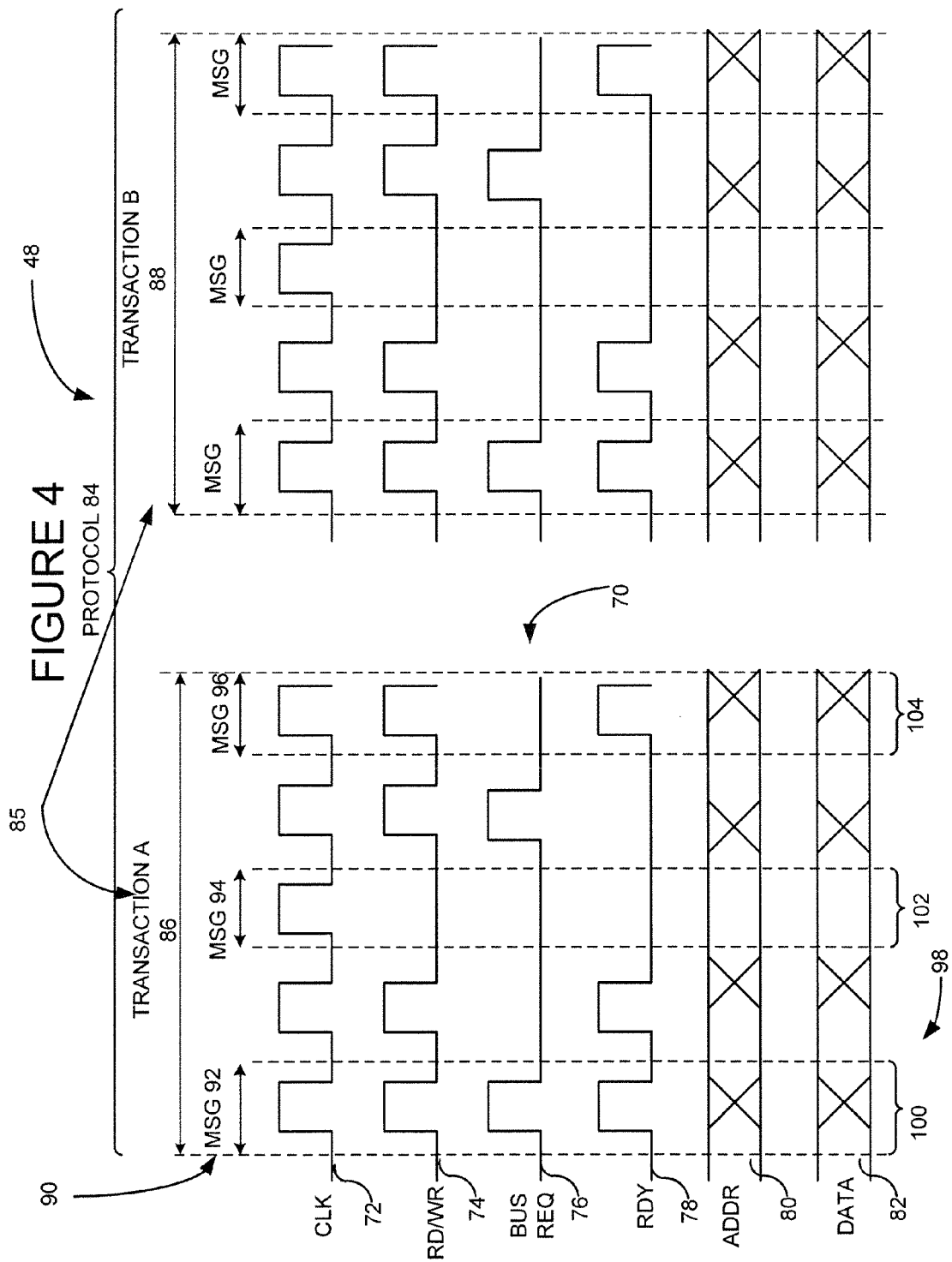
FIG. 4 is a detailed example showing simulated signal data of the circuit description on numerous hardware lines.

FIG. 3 shows a hardware diagram of a system 38 for converting a circuit description into a circuit description at the transaction level. A storage device 40 of any desired type has stored thereon the circuit design in HDL or any other desired language that may be used to describe circuits. A compiler 42 compiles the design and a protocol library 44. The compiler 42 may be any desired compiler and is usually included as part of a simulator package. The protocol library 44 includes messages and transactions associated with a protocol used by the circuit. Messages include part of a transaction, such as a request and an acknowledge of the bus, whereas a transaction is a complete operation, such as any of a variety of types of Read or Write transactions or control or setup transactions. A simulation kernel 46 simulates the compiled design in a well-known manner, as already described. The simulation kernel 46 outputs the simulation data 48 in any desired format. Box 48 can also represent a pre-simulated design data (VCD format).

Figure 5:
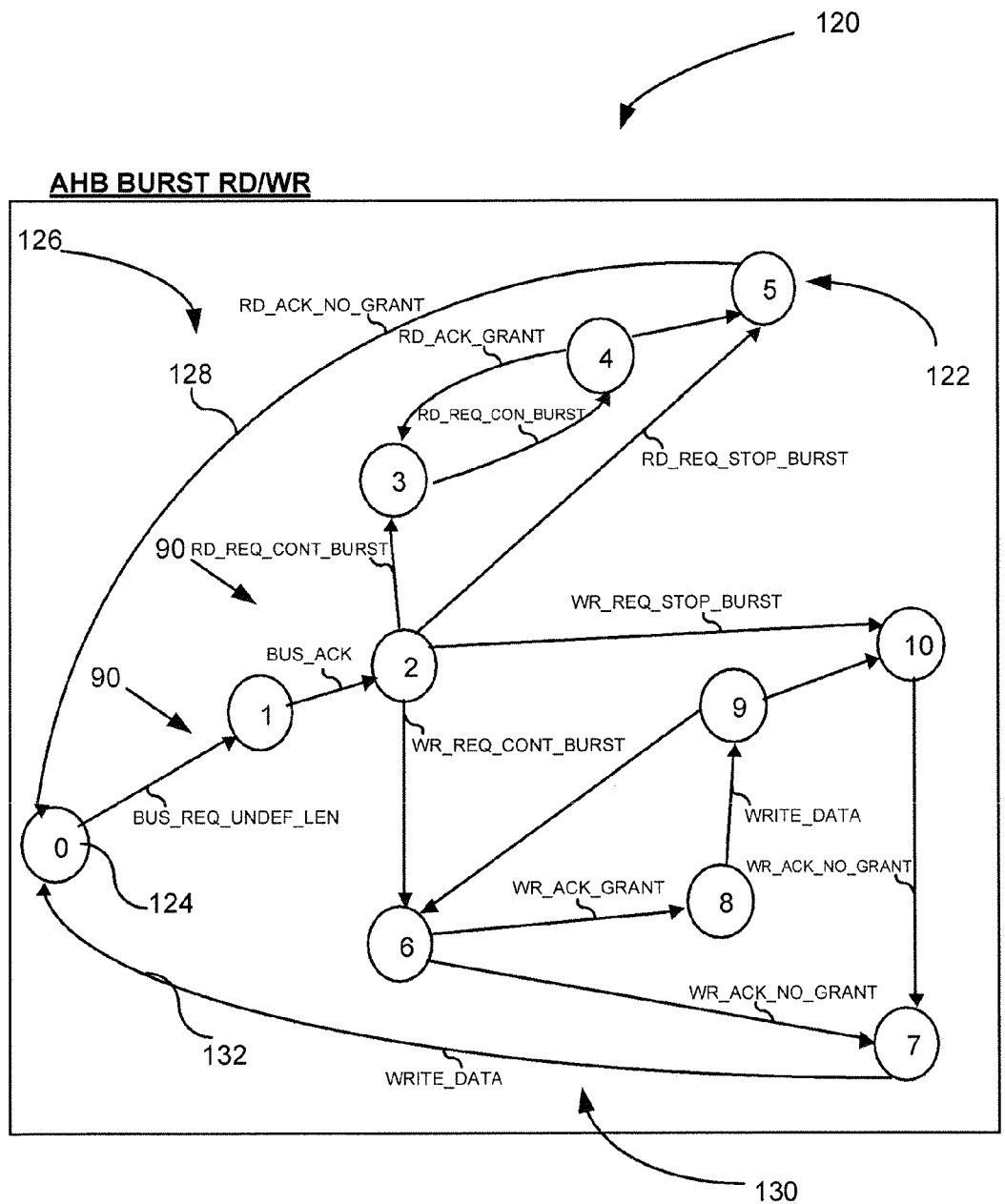
FIG. 5 is a detailed example of a state machine for some of the available transactions.
Figure 6:
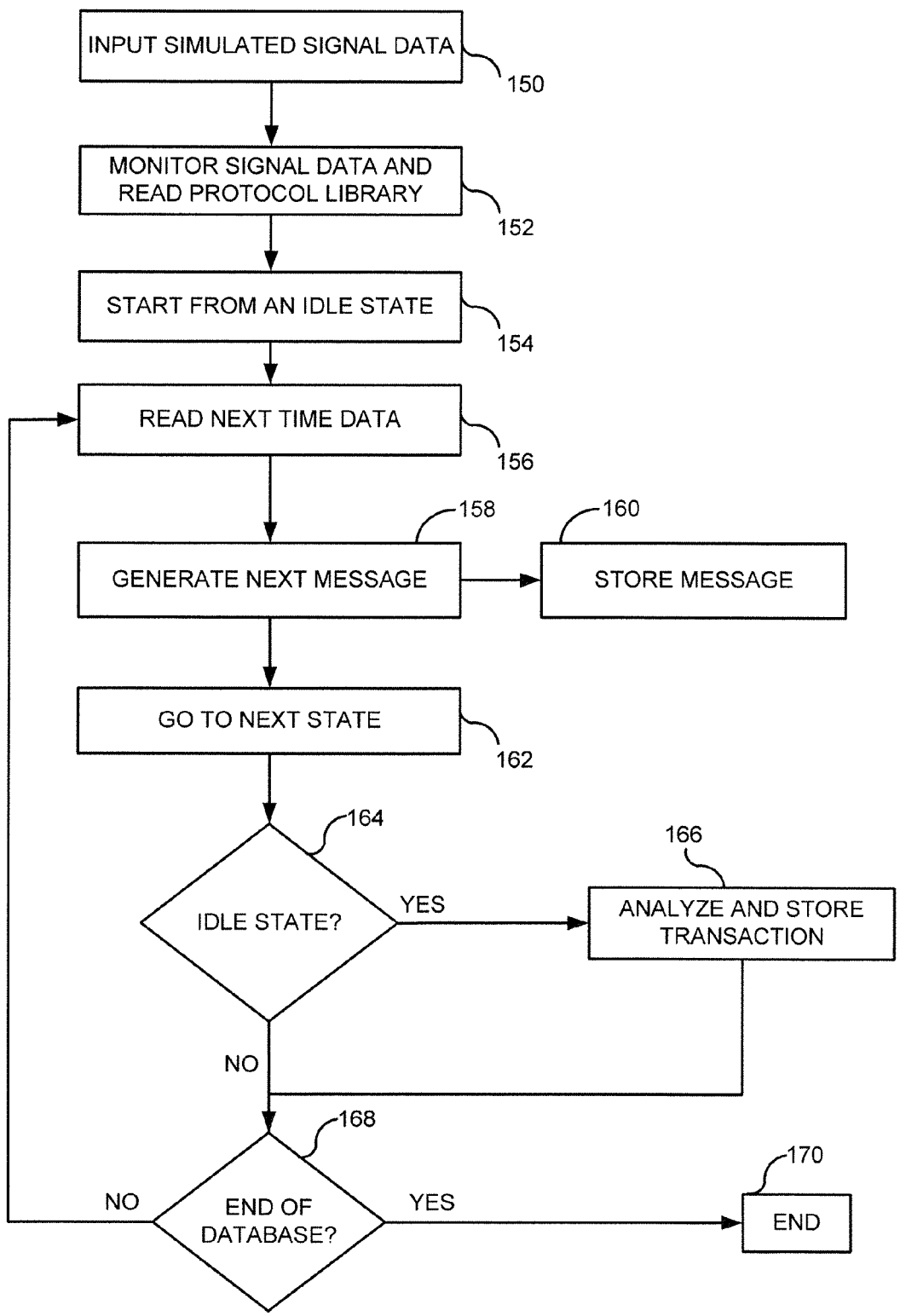
FIG. 6 is a detailed flowchart of a method for converting the simulated circuit description into transactions.

A message recognition module 50 reads the simulation data 48 and analyzes the data to convert it to messages of the protocol stored in the protocol library 44. FIGS. 4-6 describe this conversion more thoroughly, but generally switching signals of the simulation are compared (during various time slices) to messages within the protocol library 44 to determine what message is being processed during a particular time slice. The messages associated with the switching signals during each time slice are then stored to convert the switching signals into messages.

A transaction recognition module 52 reads the messages determined by the message recognition module 50 and converts the messages into transactions using a comparison of a series of messages to predetermined messages within the protocol library 44. If a match is found, then the transaction recognition module stores the series of messages as a transaction. The result is that the messages are converted into a series of transactions.

A transaction sequence recognition module 54 converts multiple transactions into a single super-transaction sequence. For example, several Writes can be converted into a single control operation. This conversion from multiple transactions to a super-transaction sequence is described further below in relation to FIG. 7. If desired, the transaction sequence recognition module 54 may be bypassed or omitted, so that the transactions are output directly. Results 56 of the conversion are output onto a storage medium or a display.

In any event, the simulated circuit description is taken to a higher level of abstraction, as the simulation data is converted first to messages, then to transactions, and finally, if desired, to transaction sequences. The compiler 42, simulator kernel 46, and modules 50, 52, 54, may all be run on the same computer. Alternatively, the circuit description may be compiled and simulated in a different location so that the resultant simulation data 48 is merely on a storage medium to be input into the message recognition module 50. In such a case, as shown at 58, it is desirable that the some of the protocol data from the protocol library 44 is incorporated into the simulation data in a pre-processing step.

FIG. 4 shows a detailed example of part of the simulated signal data 48. Various signal data 70 on hardware lines are shown including a clock line 72, a read/write line 74, a bus request line 76, a ready line 78, address lines 80, and data lines 82. Simulation is also carried out on many more hardware lines, which are not shown for convenience. The signals being simulated follow a predetermined protocol 84. A protocol is a set of rules or standards designed to enable circuit elements to communicate together and exchange information with as little error as possible. The protocol 84 is made up of a plurality of transactions 85, such as shown at 86 (i.e., transaction A) and at 88 (i.e., transaction B). A transaction is a discrete activity, such as a Read or Write operation that moves data from one place to another in the system. The transactions 86, 88 are in turn made up of a series of messages 90. For example, transaction 86 is shown as including three messages, 92, 94, and 96. A message is a smaller unit of information electronically transmitted from one circuit element to another to facilitate the transaction. Example messages include "request for bus", "acknowledge", "ready", etc. Those skilled in the art will readily recognize that these are only examples of transactions and messages and others may be used. Each message is associated with a time-slice 98, such as those shown at 100, 102, and 104. Normally, the time-slices are based on the clock signal 72. During each time-slice, the hardware lines 70 are analyzed to determine the message being sent in correspondence with the transactions of the protocol, as further described below. Transaction 88 is similar to transaction 86 and need not be further described.

FIG. 5 shows an example part of a state machine 120 stored within the protocol library 44. Different states 122 are shown as numbered circles. Messages, such as those at 90, are shown in boxes, and cause the state machine to move from one state to another. Transactions may be defined by a path through the state machine 120 that starts at an idle state 124 (state 0) and that ends at the same idle state, although those skilled in the art will recognize that the state machine 120 may be constructed in a variety of different formats. For example, a read transaction 126 is made up of numbered states 0, 1, 2, 3, 4 and 5. The read transaction 126 is completed upon return to the idle state from state 5 to state 0, as shown by arrow 128. A write transaction 130 is made up of numbered states 0, 1, 2, 6, 7, 8, 9, and 10. The write transaction 130 is completed upon return to the idle state from state 7 to state 0, as shown by arrow 132.

FIG. 6 shows a flowchart of a method preformed by the message recognition module 50 and the transaction recognition module 52 in order to convert the simulation data into a transaction-based description. At process box 150, the simulated input data (see box 48 in FIG. 3) is received so that it may be used by the message recognition module 50. Such simulation data is normally within a database. In process box 152, the analysis starts by monitoring the signal data 70 on the various hardware lines upon which messages are received. Additionally, in process box 152, the protocol library 44 is read to access a state machine, such as state machine 120, associated with the protocol. In process box 154, in order to analyze a transaction, an assumption is made that the transaction starts from the idle state 124. In process box 156, a time-slice of data is read corresponding to the clock signal on hardware line 72. For example, in FIG. 4, the data may be read starting with a time-slice 100. Thus, the switching signals on the various hardware lines are read in order to be analyzed. In process box 158, the data read is analyzed by comparing the switching signals to known patterns of messages stored in the protocol library 44. Returning briefly to FIG. 5, from the idle state 124, a bus request message changes the state of the state machine to state 1. A bus request message has a particular pattern of signal data on the hardware lines, which is compared to a known pattern in the protocol library 44. Thus, once a match is found between the known pattern of messages and the message analyzed during the currently analyzed time-slice, the message has been determined and is stored in process box 160. In process box 162, the current state of the state machine is updated to reflect the change of state. Continuing with the example, the new state is state 1 after a bus request message is received. In decision box 164, a determination is made whether the state machine has returned to the idle state. If yes, this indicates that a transaction is complete and the transaction is determined in process box 166 by comparing a sequence of the stored messages to a sequence of known messages in the protocol library 44. The sequence of stored messages are those received from the start of the idle state until the state machine returned to the idle state. Once a match is found between the sequence of stored messages and those in the protocol library, the transaction associated with those messages is easily obtained from the protocol library 44. The determined transaction is then stored as indicated in process box 166. In decision box 168, a check is made whether all of the input simulated signal data has been analyzed by reading whether the database including the signal data is at the end. If yes, the method ends as shown at 170. Otherwise, the method continues at process box 156 and the next time-slice is read (e.g., time-slice 102). Once the method ends, the database of signal data is converted into a series of transactions associated with the protocol found in the protocol database 44.

Figure 7:
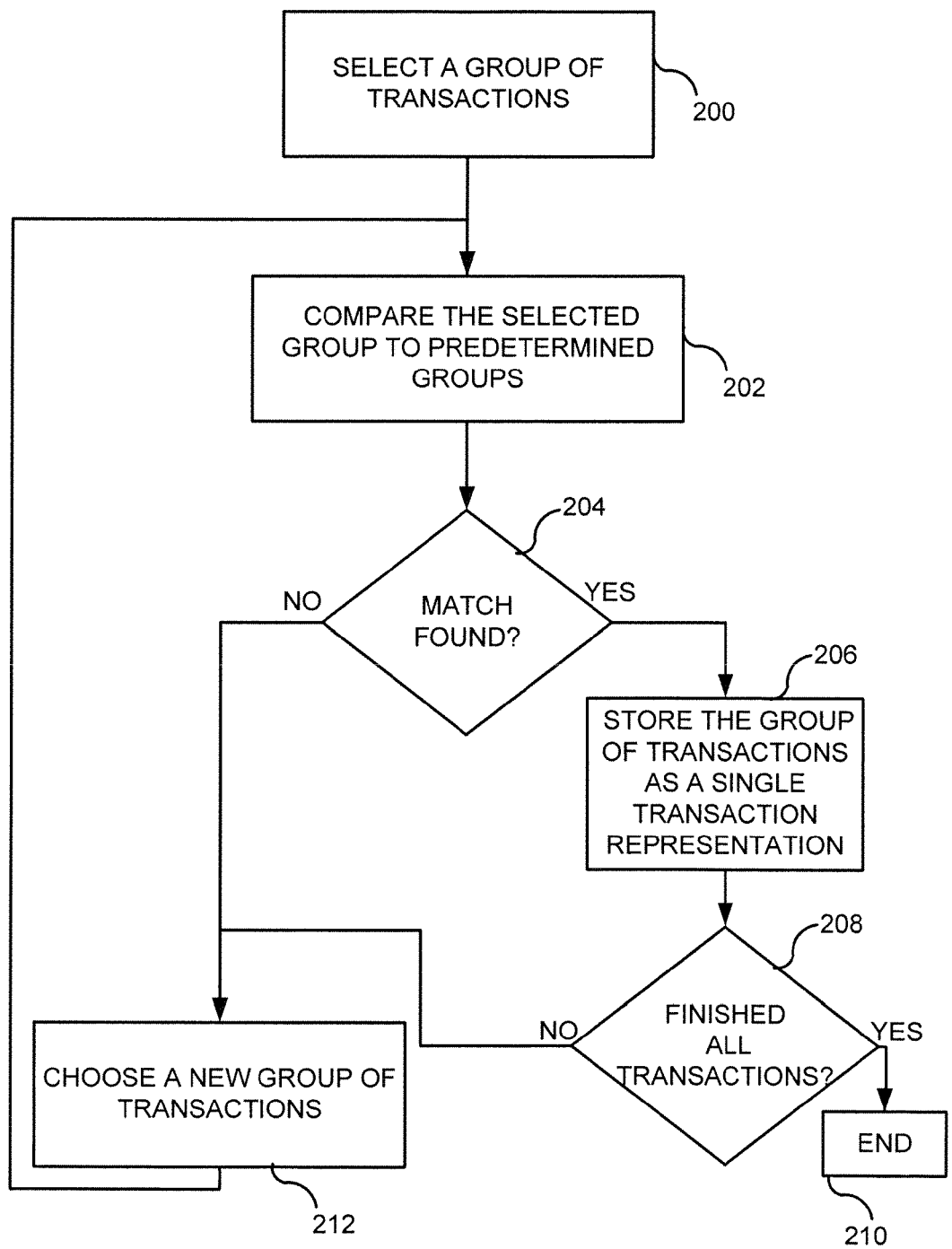
FIG. 7 is a flowchart of a method for converting a series of transactions into a super-transaction representation.
Figure 8:
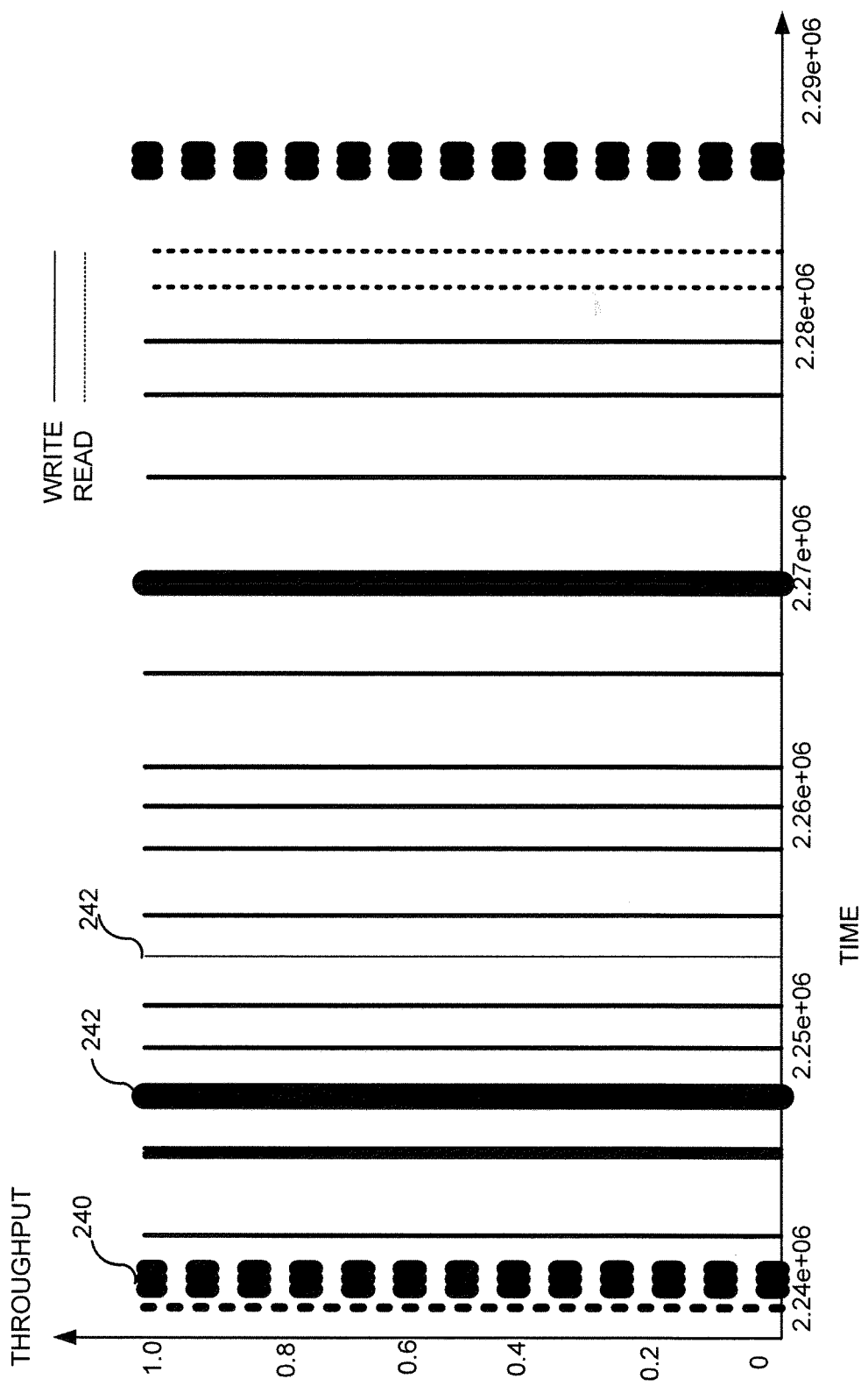
FIG. 8 shows a transaction-based view of the simulation data that may be displayed to the user.

FIG. 7 shows a method implemented by the transaction sequence recognition module 54 (see FIG. 3). It may be desirable to group transactions together in order to display to a user the circuit at an even higher level of abstraction. For example, several write/read transactions can be shown as a single control transaction as opposed to individual transactions. In process box 200, a group of transactions is selected. For example, if there are many of the same type of transactions in sequence (e.g., Reads), such a sequence may be condensed. In process box 202, the selected group is compared to predetermined groups. In decision box 204, a determination is made whether there is a match between the selected group and the predetermined groups. If there is a match, then in process box 206, the sequence of transactions is stored as a single transaction in order to convert the circuit description to an even higher level of abstraction. In decision box 208, a check is made whether all of the transactions have been read. If yes, then the method ends at 210. If not, then a new group of transactions is chosen at 212, and the process starts over at process box 202.

FIG. 8 shows an example of a display showing the simulation data of FIG. 3 at a higher level of abstraction. Particularly, instead of signals, the simulation data is shown as a series of transactions. Write transactions, such as at 240, are shown as dotted lines and read transactions, such as shown at 242, are shown as solid lines. Throughput is shown along the Y-axis and time is indicated along the X-axis. Thicker lines generally mean there is a grouping of many transactions so close in time that at the current zoom level they cannot be distinguished. Of course, a zoom option may be used to focus on particular transactions. As can readily be seen, the view of FIG. 8 is much easier to read than that of FIG. 4 and allows the designer to obtain a better overall system view of the flow of data.

Figure 9:
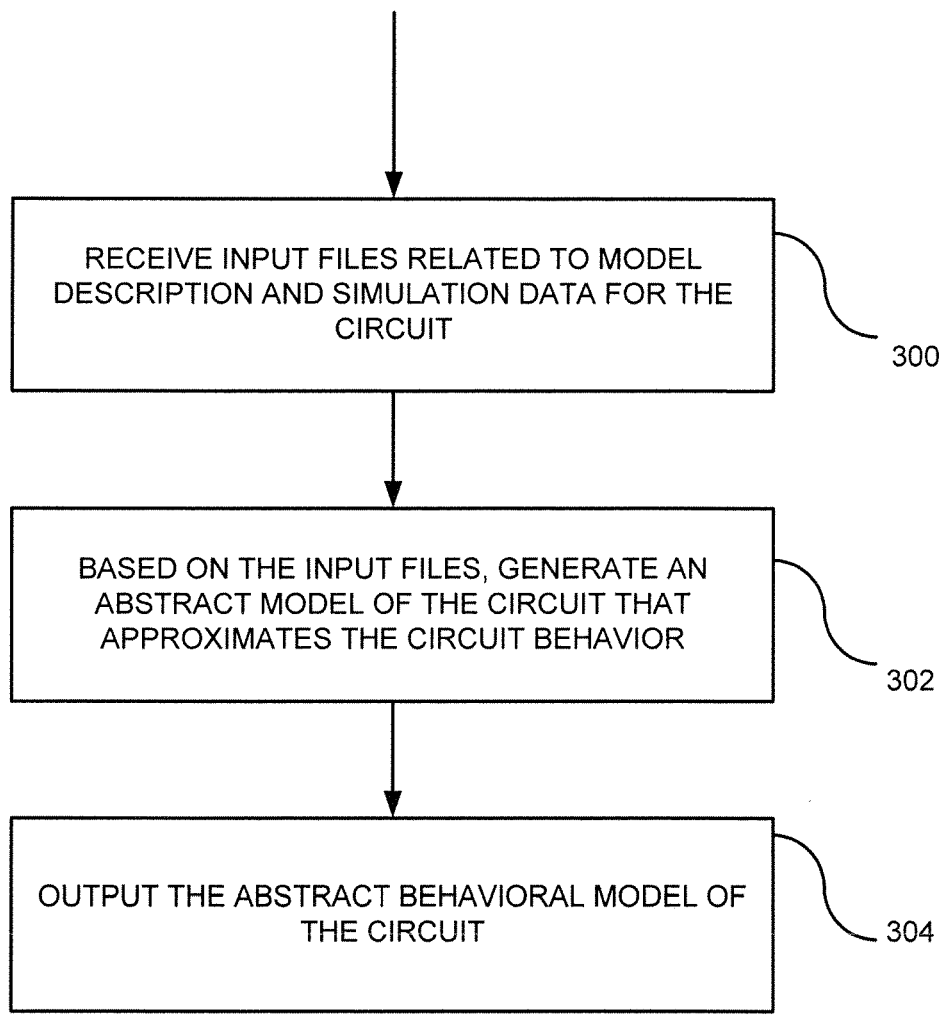
FIG. 9 is a flowchart of a method for performing model extraction of the circuit.

FIG. 9 shows a flowchart of a method for implementing model extraction 14 (FIG. 1). In process box 300, input files are received related to protocol information, model description, and simulation data for the circuit. The protocol information is provided by the user and is stored in the protocol library 44. The model description is also provided by the user and includes an interface of the circuit model describing the input/output ports and the lasting state description of the circuit model that describes the internal states elements thereof. The simulation data may be simulation data 48 (see FIG. 3) or simulation data at the transaction level 56 (FIG. 3). In process box 302, using the input files, an abstract model is generated that approximates the circuit behavior. Although particular values may be associated with the approximated circuit behavior, in general the timing aspects are the focal point. For example, a particular address and read data are of less importance than when the address arrives and when the data is output. Such parameters can be added manually as they are easier to model (functionality is in many cases more simple than timing behavior). In process box 304, the abstract behavioral model is output.

Figure 10:
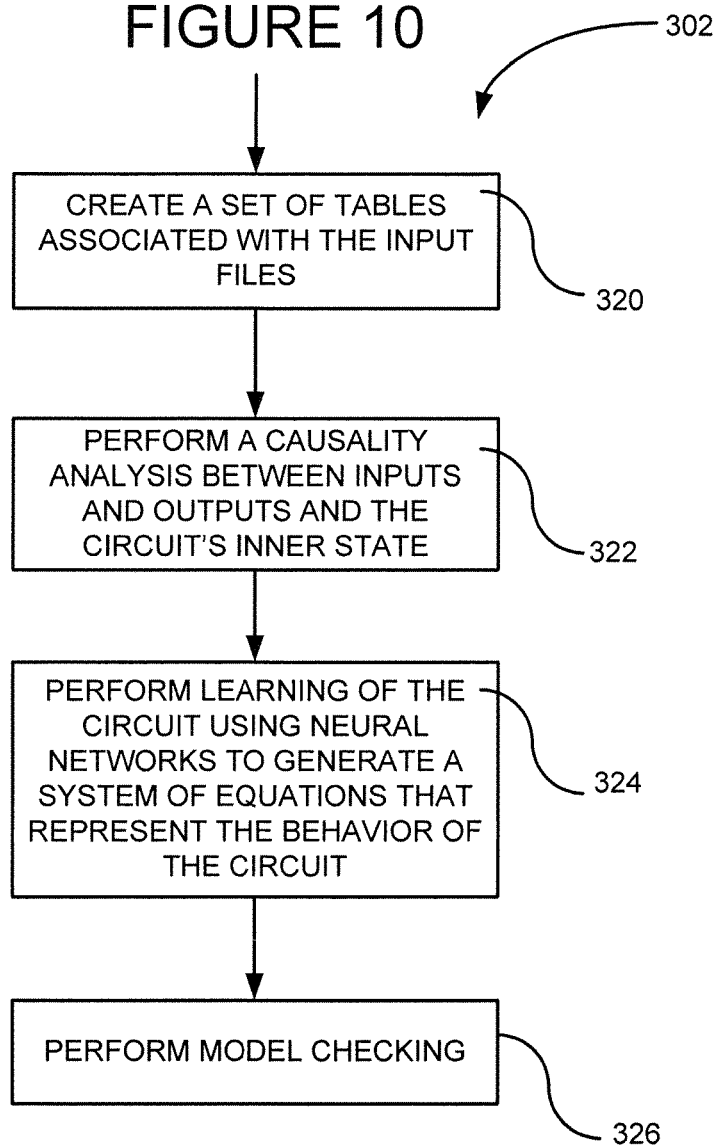
FIG. 10 is a flowchart of a method providing further details for generating an abstract model.

FIG. 10 is a flowchart of showing further details of process box 302. In process box 320, a set of tables is created that is associated with the input files. As explained further below, these tables are used to combine all of the input information into a desirable format for the causality analysis and the learning phase. In process box 322, causality analysis is performed on the tables. The causality analysis is described further in FIG. 14, but generally it is an analysis on the inputs in the table and the outputs in order to find a repetitive correlation there between. When there is a high degree of repetitive correlation of particular 'events', such events are given higher importance. On the other hand, signals that are seen only once may be disregarded in order to lessen the analysis of the learning phase. In process box 324, learning is performed. The learning is described further in FIG. 15, but generally "learning" is a standard term used in the industry, especially relating to neural networks. For example, an article entitled "Conditional Distribution Learning with Neural Networks", IEEE Signal Processing 1997, written by Tulay Hadah, Xiao Liu, and Kemal Sonmer describes some aspects of "learning" using neural networks. In process box 326 model checking is performed in order to compare the generated model to the desired results.

Figure 11:
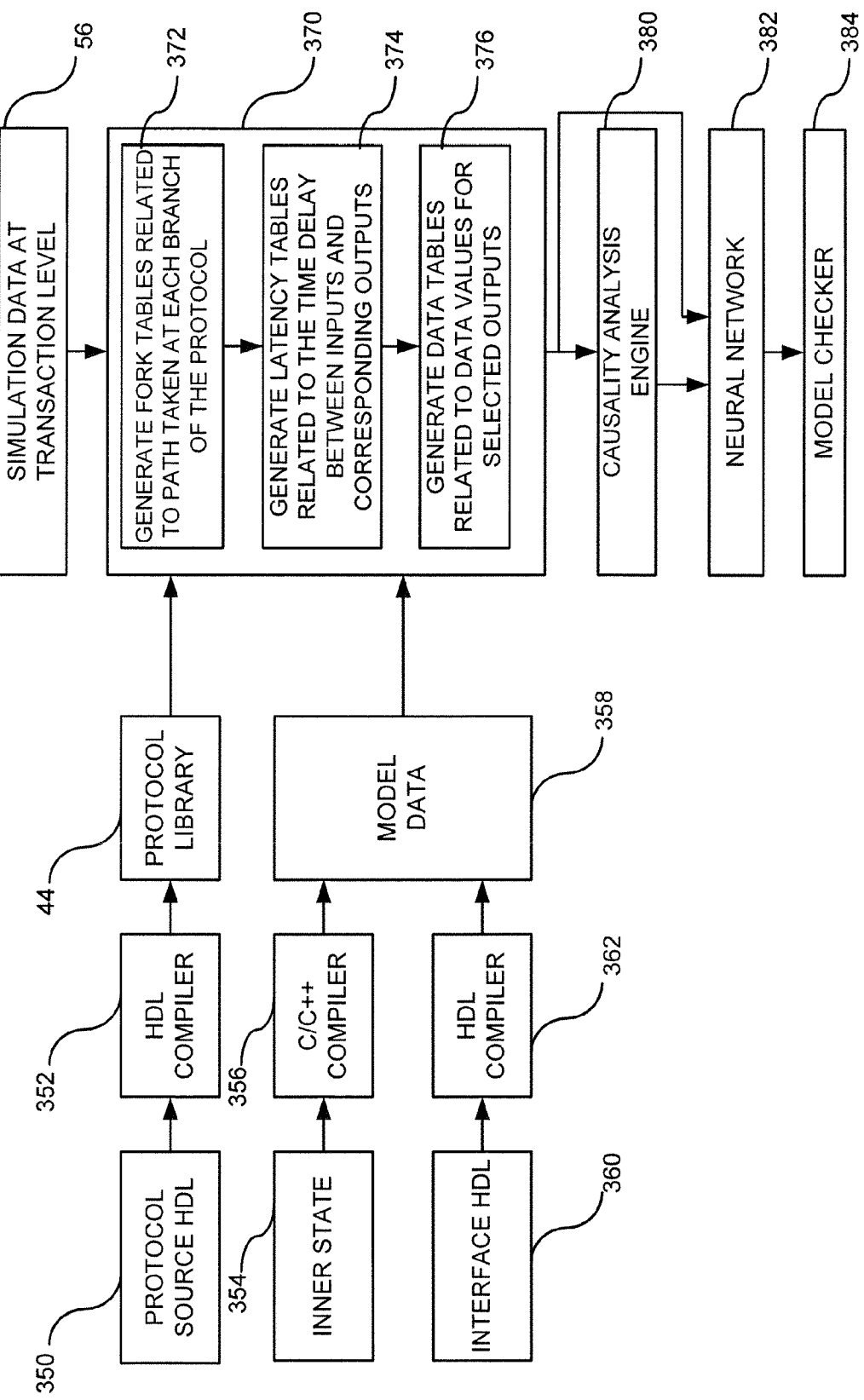
FIG. 11 is a hardware diagram of a system used to convert transaction data into an abstract model.
Figure 12:
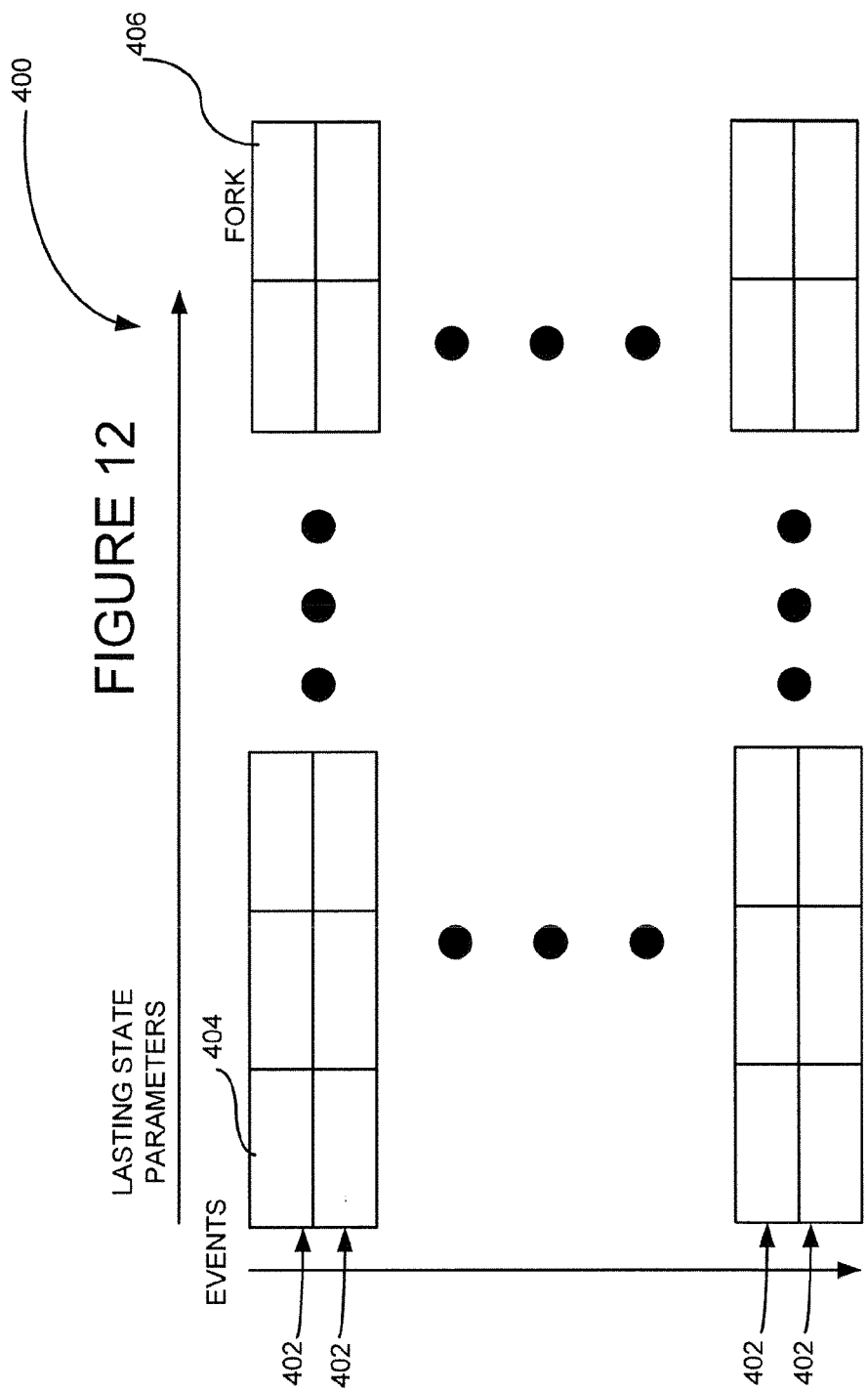
FIG. 12 is an example of a fork table used in generating the abstract model.

FIG. 11 shows a part of the system for performing the model extraction. Some aspects in FIG. 11 have been already discussed. For example, the simulation data 56 and the protocol library 44 were discussed in relation to FIG. 3. Although the simulation data 56 is shown at the transaction level, it may be simulation data 48, if desired. However, simulation data at the transaction level allows much less data to be fed into the analysis, significantly speeding the process. A protocol source file 350 is passed through a compiler 352 and the result is stored in the protocol library 44. Lasting state information source file 354 contains information regarding the inner states of the circuit being analyzed (e.g., describes registers in the circuit) and is also compiled in compiler 356 and stored in a file called Model Data 358. An interface source file 360 contains information regarding the input and output ports of the circuit being analyzed. File 360 is passed through compiler 362 and combined with the compiled lasting state file 354 within the model data file 358. The above-described compiled files are passed together with the simulation data 56 to a table generator 370. The table generator uses all of the input files to generate multiple tables, including fork tables 372, latency tables 374, and data tables 376. The fork table 372 includes information regarding which path was taken during simulation when a branch was encountered in the protocol. FIG. 12 provides an example fork table and is described further below. The latency tables 374 include information regarding the delay from a change of input until the corresponding output is changed. The data tables 376 include values associated with the output. In general, data values are not needed because timing is more interesting for the overall analysis. However, some data values may be tracked depending on options set by the user.

The table generator 370 outputs the resulting tables to the causality analysis engine 380 and to a neural network 302. As described further below, the causality analysis engine performs time-based causality analysis by applying a number of algorithms to each output message to compute the most likely causality basis. The results are also statistically analyzed and reduced so that only the most pertinent information is fed to the neural network 382. The neural network 382 generates equations that approximate the circuit behavior. Those skilled in the art will recognize that the neural network can be replaced by any other machine learning or statistical algorithm. The model checker 384 performs a check by comparing the inputs and outputs using the generated equations to the simulated data.

FIG. 12 shows an example fork table 400 generated by the table generator 370. The fork table includes multiple rows 402 representing events and multiple columns 404, most of which represent lasting state parameters. Column 406 includes a fork field. The fork field may include numbers (not shown) indicating which direction a fork was taken in association with an event and the associated lasting state parameters.

Figure 13:
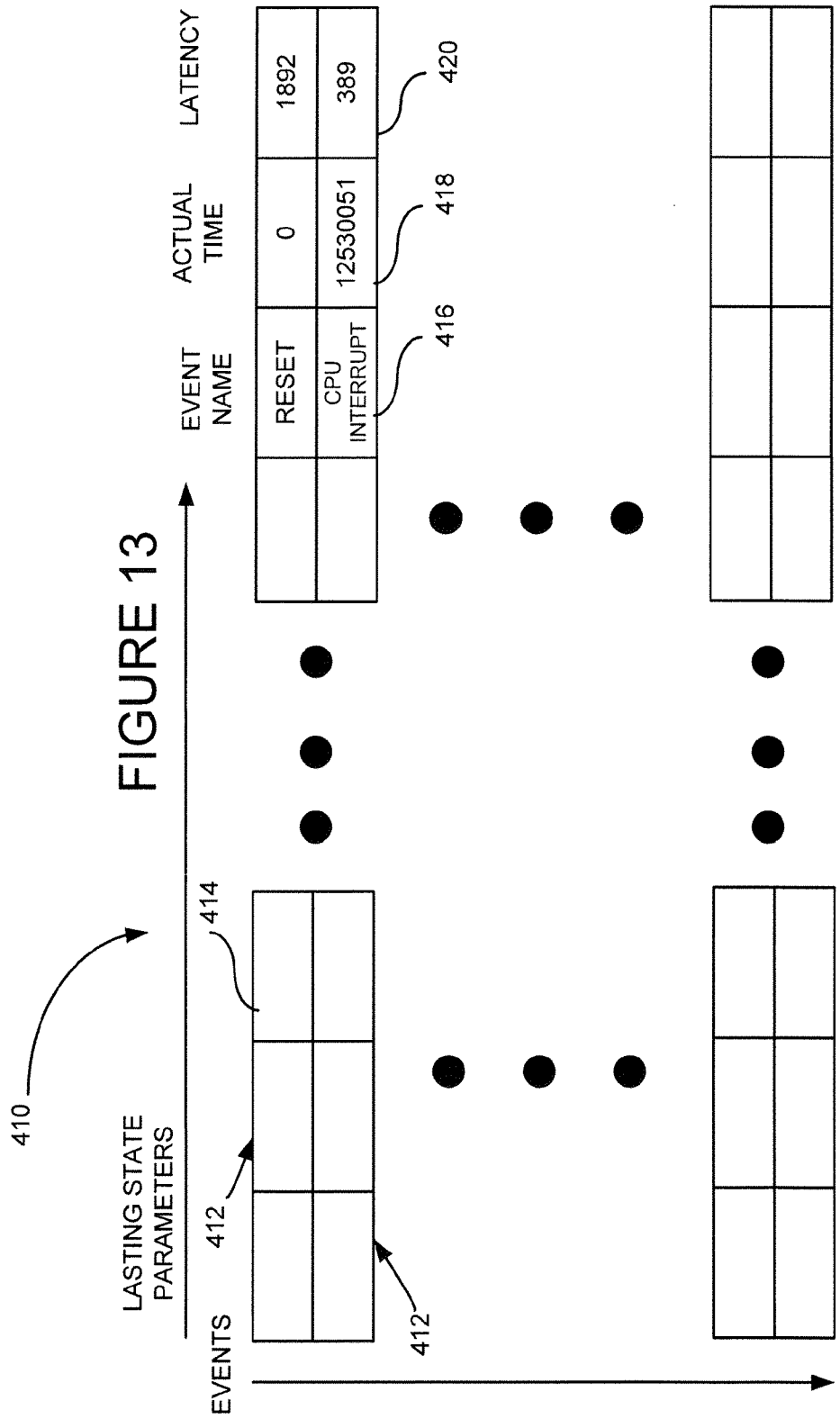
FIG. 13 is an example of a latency table used in generating the abstract model.

FIG. 13 shows an example of a latency table 410. The latency table also includes rows 412 representing events. Many columns 414 represent lasting state parameters. The last three columns 416, 418, and 420 represent the event name, the time, and the latency, respectively. Some simple examples showing possible values are shown.

As is well known, the format and fields within a table is design specific and a wide variety of different formats and fields may be used.

Figure 14:
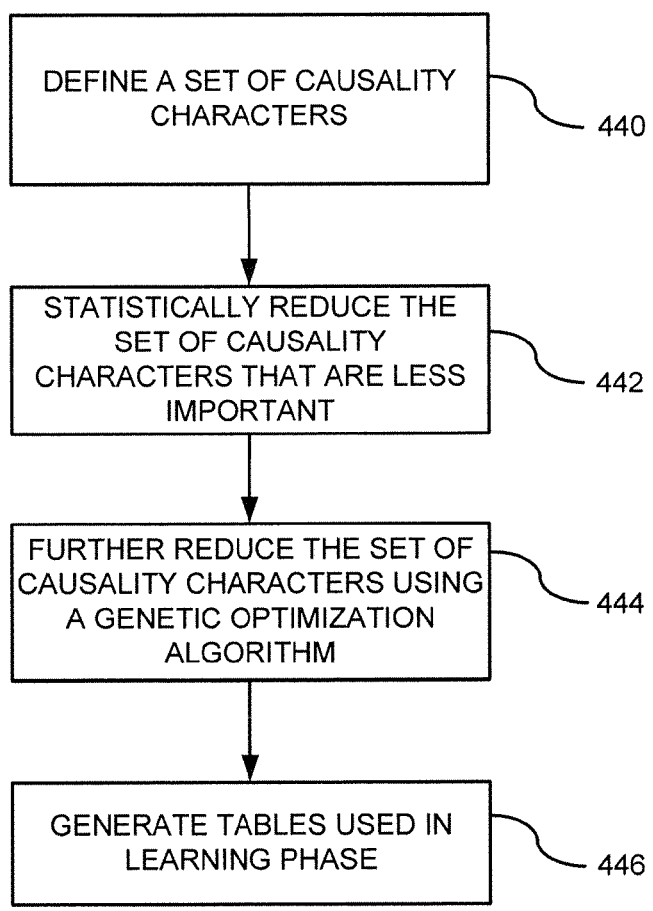
FIG. 14 is a flowchart of a method for performing causality analysis.

FIG. 14 is a flowchart of a method showing the operation of the causality engine 380. In process box 440, a set of causality characters is defined. Basically, when a repetitive correlation between inputs and outputs is found, a character is assigned to such a situation. For each output message in the latency table, causality characters are defined with each character represented as a pair having the form (event, time delta). Thus, the causality character describes a situation in which the specified event causes the output message after a given period of time. In process box 442, the number of causality characters is statistically reduced. Reduction of information ultimately provided to the learning process increases the speed of the system. Elimination of some characters can be accomplished using a hypothesis algorithm that provides a probability for a character to be part of the actual causality model. Thus, characters with limited appearances are generally eliminated. In process box 444, the causality characters are further reduced using a genetic optimization algorithm that creates a model for the least amount of causality characters possible and still allowing to choose a cause for each output message instance. In process box 446, tables are created including will and time tables. The will table relates to something that caused an output change, such as an input in combination with a lasting state. The time table relates contains the remaining character lines (after the reductions) with the latency time value.

Figure 15:
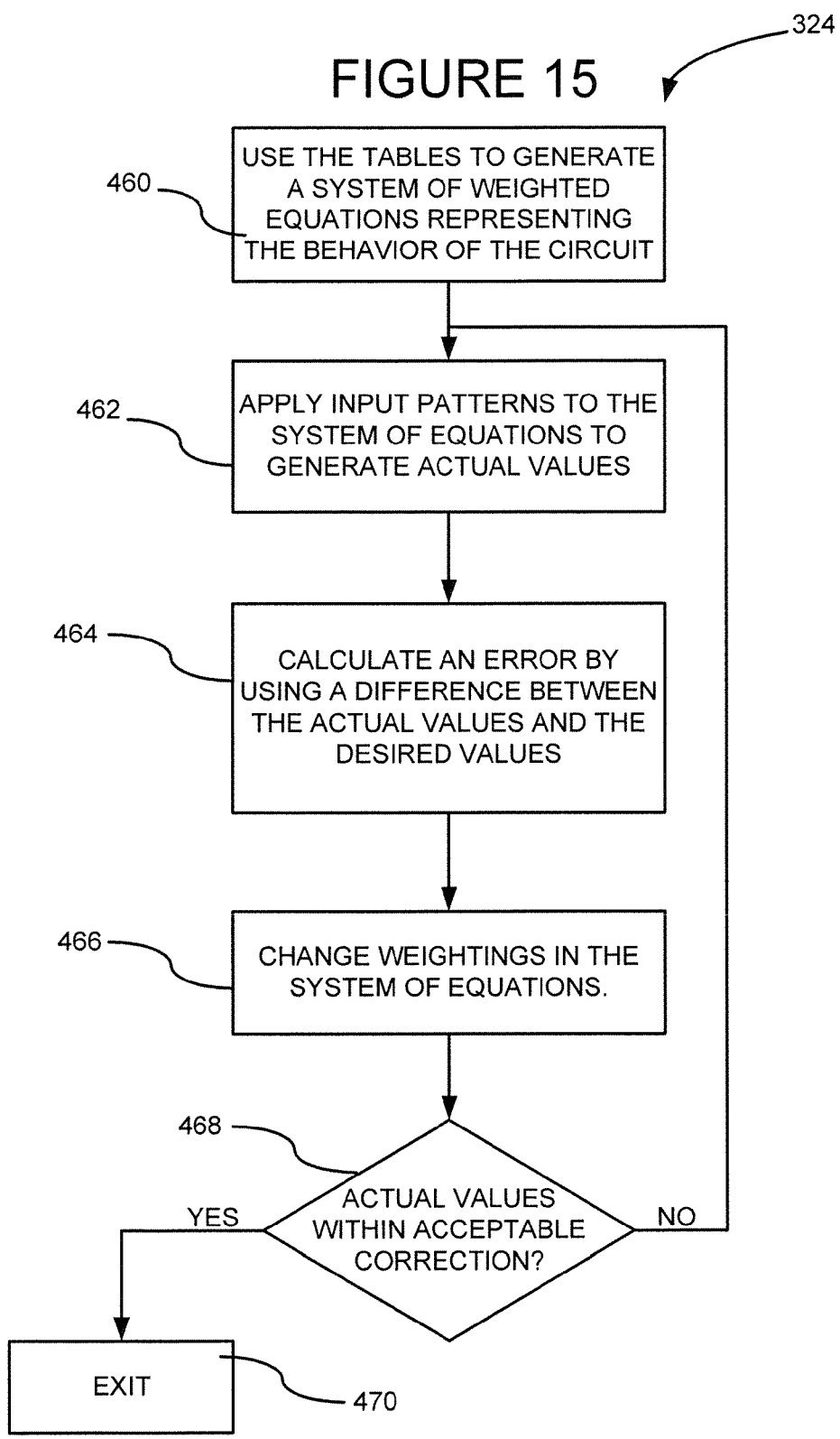
FIG. 15 is a flowchart of a method performed by a neural network for generating a system of equations approximating the circuit behavior.

FIG. 15 is a flowchart of a method for performing "learning" 324 (FIG. 10). In process box 460, the tables generated in process box 446 (FIG. 14) are used as well as tables generated from the table generator 370 (FIG. 11) in order to create a system of weighted equations that represent the behavior of the circuit. Thus, for example, the inputs and outputs are analyzed in conjunction with state information to generate the equations. Such a generation of equations is well known in the art using standard techniques of neural networks. In process box 462, input patterns are applied to the generated system of equations to generate actual values produced by the equations. In process box 464, an error is calculated by using a difference between the actual values (process box 462) to the desired values (determined during simulation). In process box 466, based on this difference, the weightings in the system of equations are modified in order to more closely match the desired values. In decision box 468, a check is made whether the actual values generated by the system of equations are within an acceptable limit. If so, the flowchart is exited at 470. In not, the flow returns to process box 462 in order to re-analyze the equations.

Figure 16:
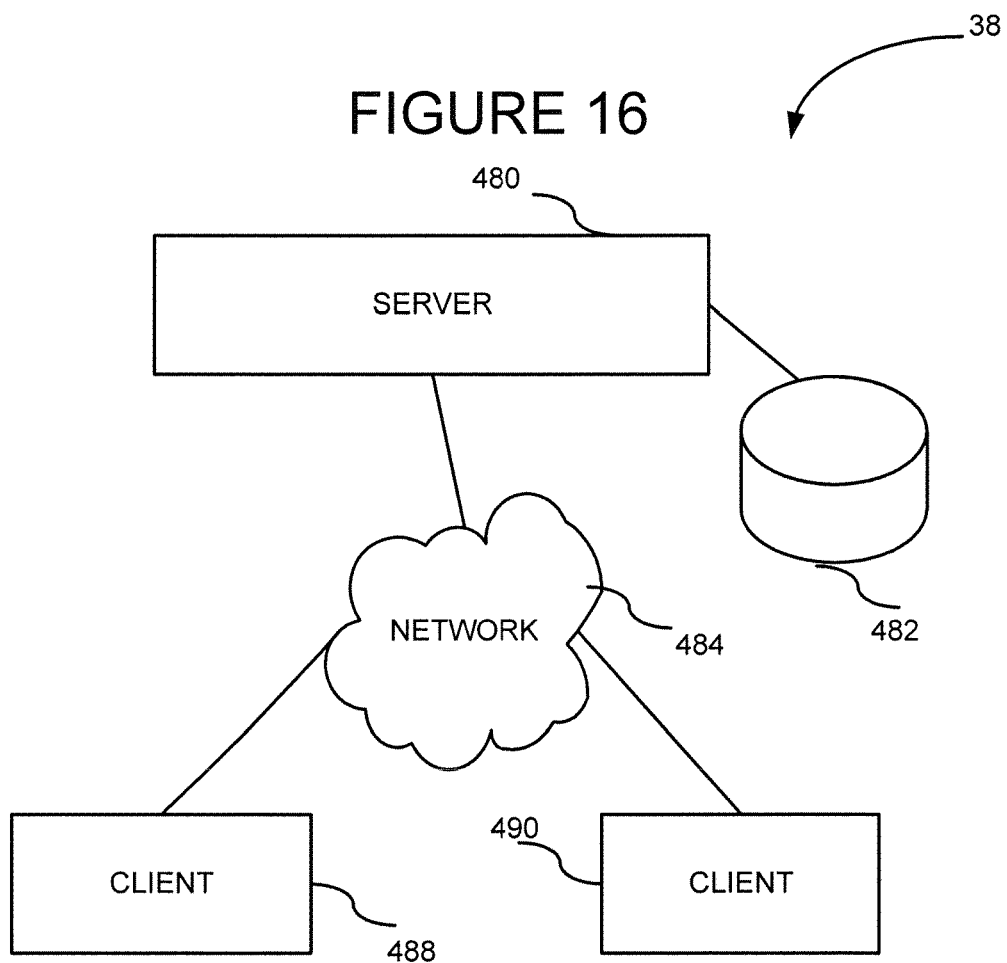
FIG. 16 shows a network that may be used to implement the invention.

FIG. 16 shows that portions of the system may be applied to a distributed network, such as the Internet. Of course, the system also may be implemented without a network (e.g., a single computer). A server computer 480 may have an associated database 482 (internal or external to the server computer). The server computer is coupled to a network shown generally at 484. One or more client computers, such as those shown at 488 and 490, are coupled to the network to interface with the server computer using a network protocol.

FIG. 17 shows a flow diagram using the network of FIG. 16. In process box 500, the circuit description to be transformed is sent from a client computer, such as 488, to the server computer 480. In process box 502, the abstract model of the circuit description is generated that approximates or imitates the circuit behavior, as previously described. In process box 504, the generated abstract model is checked against simulation results. In process box 506, the results are sent though the network to the client computer 488. Finally, in process box 508, the results are displayed to the user. It should be recognized that one or more of the process boxes may be performed on the client side rather than the server side, and vice versa.

Having illustrated and described the principles of the illustrated embodiments, it will be apparent to those skilled in the art that the embodiments can be modified in arrangement and detail without departing from such principles.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

We claim:

1. A method for generating an abstract model of a circuit, the method comprising:
   determining a series of transactions of a protocol associated with low-level simulation data from a simulation of the circuit;
   determining transaction-level circuit simulation data based at least in part on the series of transactions of the protocol;
   using one or more computers or processors, performing causality analysis on the transaction-level circuit simulation data to determine an association between input signals and output signals, the causality analysis comprising defining a set of causality characters based on the association between the input and output signals, wherein a causality character represents an association between an event and an associated output, and statistically reducing the set of causality characters;
   using the one or more computers or processors, producing a causality output based on the causality analysis; and
   using the one or more computers or processors, learning the circuit behavior using the causality output in order to produce the abstract model including a system of equations that approximate the circuit behavior.

2. The method of claim 1, wherein the determining a series of transactions of a protocol associated with low-level simulation data from a simulation of the circuit comprises:
   analyzing switching signals, from the low-level simulation data, on simulated hardware lines of the circuit; and
   determining transactions of a protocol associated with the analyzed switching signals.

3. The method of claim 1, wherein learning the circuit behavior comprises:
   generating a system of weighted equations representing the behavior of the circuit based on the causality output;
   applying input patterns to the system of weighted equations to generate actual output values;
   calculating an error using a difference between the actual values and desired values; and
   modifying the weightings in the system of weighted equations based on the calculated error.

4. The method of claim 1, wherein performing causality analysis further comprises generating tables based on the reduced set of causality characters, and wherein the tables comprise fork tables and latency tables, the fork tables comprising state information and path information associated with the circuit and the latency tables comprising a latency period associated with a simulated event.

5. The method of claim 1, wherein the abstract model is in an electronic-system-level model.

6. The method of claim 1, wherein performing causality analysis further comprises determining repetitive behavior between multiple input and output signals of the simulation data.

7. The method of claim 1, further comprising reducing the set of causality characters using a genetic optimization algorithm.

8. A method for generating an abstract model of a circuit, comprising:
   receiving a circuit simulation description in a register transfer level having a first level of abstraction;
   by computing hardware, converting the circuit simulation description into a transaction level description, the converting comprising analyzing switching signals from the received circuit simulation description on simulated hardware lines of the circuit and determining transactions of a circuit protocol associated with the analyzed switching signals; and
   using a neural network, converting the transaction level description into a transaction level model having a second level of abstraction, different from the first level of abstraction, the converting comprising:
      generating a system of weighted equations representing the behavior of the circuit;
      applying input patterns to the system of weighted equations to generate actual output values;
      calculating an error using a difference between the actual values and desired values; and
      modifying weightings in the system of weighted equations based on the calculated error.

9. The method of claim 8, wherein converting further comprises generating fork tables and latency tables, wherein the fork tables include state information and path information associated with the circuit and the latency tables include a latency period associated with a simulated event.

10. The method of claim 8, wherein the converting further comprises performing causality analysis by analyzing inputs and outputs to the circuit to find a repetitive correlation therebetween.

11. The method of claim 10, wherein the performing of the causality analysis further includes defining a set of causality characters, each causality character representing an association between an event and an output, and reducing the set of causality characters through statistical analysis.

12. The method of claim 11, wherein the performing of the causality analysis further includes reducing the set of causality characters using a genetic optimization algorithm.

13. The method of claim 8, wherein converting the circuit simulation description into a transaction level description further comprises:
   storing a converted transaction level description of the circuit simulation as a series of the determined transactions.

14. A hardware device storing computer-readable instructions for performing a method for generating an abstract model of a circuit, the method comprising:
   performing causality analysis on circuit simulation data to determine an association between input signals and output signals;
   producing a causality output based on the causality analysis; and
   learning a behavior of the circuit using the causality output in order to produce an abstract model of the circuit including a system of equations that approximate the circuit behavior, wherein performing causality analysis comprises:
      defining a set of causality characters based on the association between the input and output signals, wherein a causality character represents an association between an event an associated output; and
      statistically reducing the set of causality characters;
   the method further comprising converting low-level simulation data to the simulation data at the transaction-level, the converting comprising:
      reading the low-level simulation data from a simulation of the circuit;
      analyzing switching signals, from the low-level simulation data, on simulated hardware lines of the circuit;
      determining transactions of a protocol associated with the analyzed switching signals; and
      storing a converted description of the simulated circuit as a series of the determined transactions.

* * * * *